United States Patent
Ionescu

(10) Patent No.: US 8,669,759 B2
(45) Date of Patent: Mar. 11, 2014

(54) OMNIPOLAR MAGNETIC SWITCHES

(75) Inventor: Mihai Alexandru Ionescu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 348 days.

(21) Appl. No.: 13/076,593

(22) Filed: Mar. 31, 2011

(65) Prior Publication Data
US 2012/0249124 A1 Oct. 4, 2012

(51) Int. Cl.
*G01B 7/14* (2006.01)

(52) U.S. Cl.
USPC ...................................................... 324/207.2

(58) Field of Classification Search
USPC .................... 324/160–164, 207.11–207.25
See application file for complete search history.

(56) References Cited

U.S. PATENT DOCUMENTS

| | | | | |
|---|---|---|---|---|
| 3,906,486 A * | 9/1975 | Phillips | ........................ | 341/128 |
| 4,268,888 A | 5/1981 | Bodig | | |
| 4,413,950 A * | 11/1983 | Wiernicki | ........................ | 417/53 |
| 4,893,027 A * | 1/1990 | Kammerer et al. | ........................ | 307/116 |
| 5,278,462 A * | 1/1994 | Wilson | ........................ | 327/79 |
| 5,306,968 A * | 4/1994 | Kimura | ........................ | 327/28 |
| 5,619,137 A * | 4/1997 | Vig et al. | ........................ | 324/251 |
| 5,933,344 A * | 8/1999 | Mitsuishi et al. | ........................ | 700/13 |
| 6,346,812 B1 * | 2/2002 | May et al. | ........................ | 324/253 |
| 6,356,741 B1 | 3/2002 | Bilotti | | |
| 6,622,012 B2 | 9/2003 | Bilotti | | |
| 7,021,587 B1 * | 4/2006 | Younkin | ........................ | 244/178 |
| 7,071,640 B2 * | 7/2006 | Kurosawa et al. | ........................ | 318/400.04 |
| 7,085,119 B2 | 8/2006 | Bilotti | | |
| 7,307,824 B2 | 12/2007 | Bilotti | | |
| 2003/0184460 A1 * | 10/2003 | Johnson et al. | ........................ | 341/133 |
| 2008/0297082 A1 * | 12/2008 | Kurosawa et al. | ........................ | 318/400.11 |
| 2009/0009273 A1 * | 1/2009 | Ku | ........................ | 335/78 |
| 2010/0079138 A1 * | 4/2010 | David et al. | ........................ | 324/251 |
| 2010/0117715 A1 * | 5/2010 | Ariyama | ........................ | 327/512 |
| 2011/0089930 A1 * | 4/2011 | Eckrich et al. | ........................ | 324/76.77 |
| 2011/0216453 A1 * | 9/2011 | Haines et al. | ........................ | 361/49 |
| 2012/0119734 A1 * | 5/2012 | Han | ........................ | 324/251 |

FOREIGN PATENT DOCUMENTS

CN 101825690 A * 9/2010

OTHER PUBLICATIONS

Allegro Microsystems, Inc., A3211 and A3212 Micropower, Ultrasensitive Hall-Effect Switches, Rev. 13, located at www.allegromicro.com/en/Products/Part_Numbers/3212/index.asp on Mar. 31, 2011, 13 pages.
Allegro Microsystems, Inc., A1171 Micropower Ultrasensitive Hall Effect Switch, Rev. 4, located at www.allegromicro.com/en/Products/Part_Numbers/1171/ on Mar. 31, 2011, 10 pages.
Infineon Technologies, TLE4917, pp. 1-13, © Infineon Technologies AG, 2000, Published by Infineon Technologies AG.

* cited by examiner

*Primary Examiner* — Jermele M Hollington
*Assistant Examiner* — Demetrius Pretlow
(74) *Attorney, Agent, or Firm* — Patterson Thuente Pedersen, P.A.

(57) ABSTRACT

Embodiments relate to omnipolar magnetic field switches. In one embodiment, omnipolar behavior is generated in a Hall effect switch by extracting the modulus of the electric signal generated by the Hall transducer and feeding it to a single high-precision comparator, without any sampling or additional processing steps. The modulus extraction and threshold evaluation can be done in parallel.

20 Claims, 5 Drawing Sheets

OMNIPOLAR MAGNETIC SWITCHES

TECHNICAL FIELD

The invention relates generally to magnetic sensors and more particularly to facilitating omnipolar behavior in magnetic field switches.

BACKGROUND

Magnetic field switches, such as Hall effect switches, are a type of magnetic sensor with a digital output that toggles from high to low and from low to high when certain levels of the magnetic field intensity are sensed. Such switches are often used for proximity sensing, and the magnetic field-versus-output voltage characteristics include a certain amount of hysteresis in order to provide noise immunity.

The output behavior of these switches can be unipolar, bipolar or omnipolar. In unipolar switches, the output is dependent upon both the magnitude of the field and the polarity. For some applications, however, dependence on the polarity is not desired, and omnipolar switches are therefore desired. Conventional omnipolar switches use, for example, two cross-coupled hysteresis comparators with digital processing or other solutions typically requiring multi-step evaluation to create omnipolar behavior. For some applications, such solutions are not appropriate because they are too slow or exhibit other undesirable characteristics.

Therefore, there is a need for improved omnipolar magnetic field switches.

SUMMARY

Embodiments relate to omnipolar magnetic switches, systems and methods.

In an embodiment, an omnipolar magnetic switch comprises a magnetic sensor configured to generate an electric signal from a sensed magnetic field; switching circuitry coupled to the magnetic sensor to receive and selectively invert the electric signal; a first comparator coupled to the switching circuitry to receive the electric signal or an inverted electrical signal as input from the switching circuitry and to evaluate an amplitude of the input and toggle high or low when the amplitude passes above a first threshold or below a second threshold; a second comparator coupled to inputs of the first comparator to detect positive-to-negative and negative-to-positive transitions of the electric signal generated by the magnetic sensor; and polarity detection circuitry coupled to the second comparator to detect a positive-to-negative transition and coupled to the switching circuitry to instruct the switching circuitry to selectively invert the electric signal when a positive-to-negative transition is detected.

In an embodiment, a method of providing an omnipolar magnetic switch comprises sensing a magnetic field signal; converting the magnetic field signal into an electric signal; detecting a positive-to-negative transition of the electric signal; inverting the electric signal upon detection of a positive-to-negative transition; and toggling an output when an amplitude of the electric signal passes above a first threshold or below a second threshold.

In an embodiment, an omnipolar switch comprises a magnetic sensor; switching circuitry coupled to an output of the magnetic sensor; first comparator circuitry coupled to an output of the switching circuitry; second comparator circuitry coupled to the output of the switching circuitry; polarity detecting circuitry coupled to an output of the second comparator circuitry and to an input of the switching circuitry.

In an embodiment, an omnipolar magnetic switch comprises a magnetic sensor configured to generate an electric signal from a sensed magnetic field; a first comparator coupled to the magnetic sensor to receive the electric signal and to evaluate an amplitude of the input and toggle high or low when the amplitude passes above a first threshold or below a second threshold; a second comparator coupled to inputs of the first comparator to detect positive-to-negative and negative-to-positive transitions of the electric signal generated by the magnetic sensor; polarity detection circuitry coupled to the second comparator to detect positive-to-negative and negative-to-positive transitions and coupled to the first comparator to instruct the first comparator to selectively invert the electric signal when positive-to-negative and negative-to-positive transitions are detected; and hysteresis and offset generation circuitry coupled between the polarity detection circuitry and the first comparator.

In an embodiment, a signal modulus extraction circuit comprises an electrical signal generator to generate an electrical signal; switching circuitry coupled to the signal generator to receive and selectively invert the electrical signal; a comparator coupled to an output of the switching circuitry to detect positive-to-negative and negative-to-positive transitions of the electrical signal generated by the electrical signal generator; and polarity detection circuitry coupled to an output of the comparator to instruct the switching circuitry to selectively invert the electrical signal when a positive-to-negative transition is detected.

In an embodiment, an omnipolar magnetic switch comprises a magnetic sensor configured to generate an electric signal from a sensed magnetic field; switching circuitry coupled to the magnetic sensor to receive and selectively invert the electric signal; a first comparator coupled to the switching circuitry to receive at least one of the electric signal or an inverted electric signal as input from the switching circuitry and to evaluate an amplitude of the input and toggle high or low when the amplitude passes above a first threshold or below a second threshold; a second comparator coupled to the magnetic sensor to receive the electric signal and detect positive-to-negative and negative-to-positive transitions of the electric signal; and polarity detection circuitry coupled to the second comparator to detect positive-to-negative and negative-to-positive transitions and coupled to the switching circuitry to instruct the switching circuitry to selectively invert the electric signal when positive-to-negative and negative-to-positive transitions are detected.

BRIEF DESCRIPTION OF THE DRAWINGS

The invention may be more completely understood in consideration of the following detailed description of various embodiments of the invention in connection with the accompanying drawings, in which.

Figure 1:
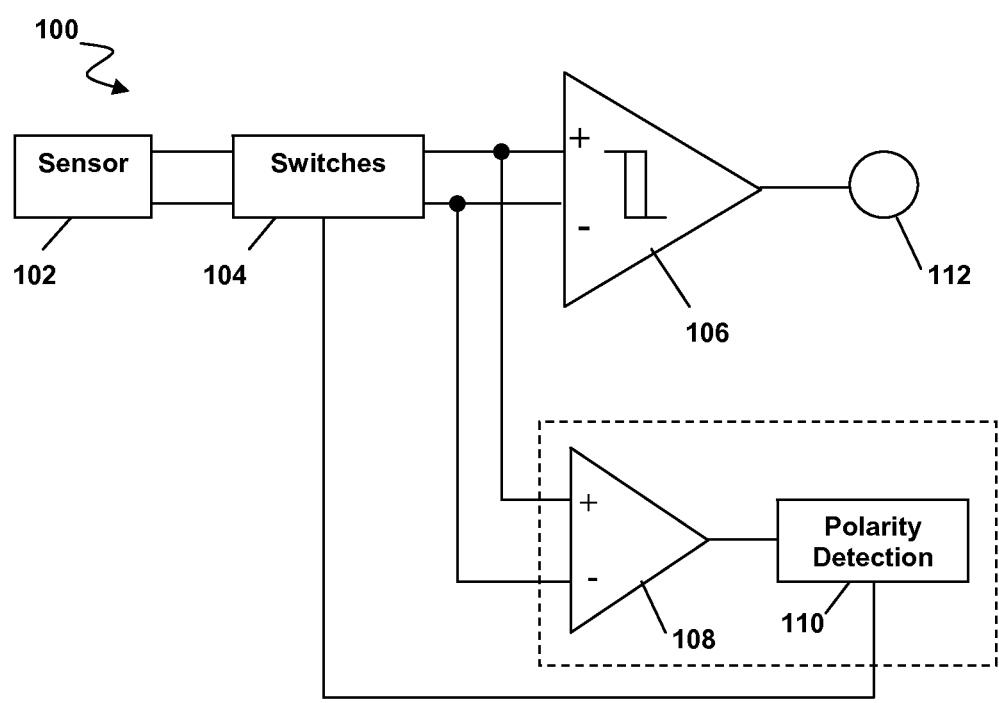
FIG. 1 depicts a block diagram of circuitry according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to omnipolar magnetic field switches. In one embodiment, omnipolar behavior is generated in a Hall effect switch by extracting the modulus of the electric signal generated by the Hall transducer and feeding it to a single high-precision comparator, without any sampling or additional number of processing steps. The modulus extraction and threshold evaluation can be done in parallel.

Referring to FIG. 1, an embodiment of an omnipolar magnetic switch 100 is depicted. In one embodiment, switch 100 comprises a magnetic sensor 102, a block of switches 104, a main comparator 106, a polarity comparator 108, polarity detector circuitry 110 and an output 112.

In one embodiment, magnetic sensor 102 is a Hall sensor. In other embodiments, some other appropriate magnetic field sensor or element is used. Sensor 102 senses a magnetic field and converts the sensed magnetic field into a differential electrical signal, which is fed to switches block 104, which comprises one or more switches. In embodiments, switches block 104 can pass the signal unaltered or invert its sign, as will be discussed herein below.

Figure 2:
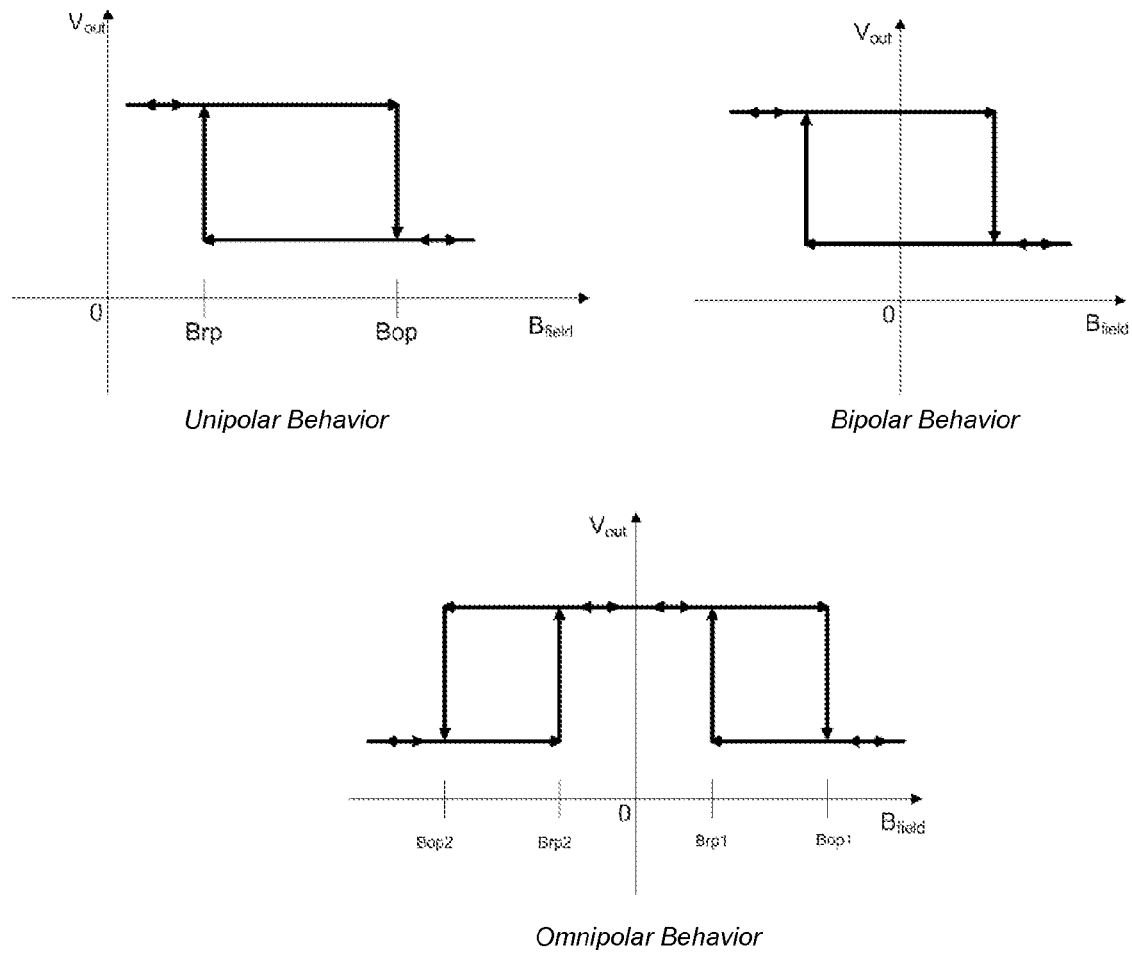
FIG. 2 depicts graphs of unipolar, bipolar and omnipolar behavior according to embodiments.

From switches block 104, the signal is fed to main comparator 106 and polarity comparator 108. Referring also to FIG. 2, comparator 106 generates four thresholds of omnipolar behavior: Bop1, Brp1, Bop2 and Brp2. Within pair Bop1 and Bop2, as well as pair Brp1 and Brp2, each has the same amplitude but opposite signs, with the equality generated by the fact that comparator 106 sees only the modulus of the magnetic signal. Bop1 occurs when the output switches from high to low while the magnetic field is positive. Brp1 occurs when the output switches from low to high while the magnetic field is positive. Bop2 occurs when the output switches from high to low while the magnetic field is negative. Brp2 occurs when the output switches from low to high while the magnetic field is negative.

In one embodiment, main comparator 106 is a high-precision comparator with incorporated offset and hysteresis. Offset is defined as (Bop+Brp)/2, and an omnipolar switch has two offsets, one positive and one negative. Ideally, the values are equal. Hysteresis is defined as (Bop−Brp), and an omnipolar switch again has two which are also equal, ideally.

Comparator 108 is designated as a polarity comparator and is, in one embodiment, a relatively small-area, low-precision comparator when compared with comparator 106. Comparator 108 is operable in embodiments to detect a zero-passing of the electric signal. In embodiments, some form of hysteresis is generally required by polarity comparator 108 for noise immunity at the transitions through zero.

The digital output of comparator 108 is fed to polarity detector circuitry 110, a digital circuit sensitive only to the positive-to-negative transitions of the electrical signal generated at the output of switches block 104. When such a transition is detected, circuitry 110 generates a signal that triggers switches block 104 to invert its output signal. Thus, the output signal of switches block 104 would then become positive again. A negative-to-positive transition, however, would not affect polarity detection circuitry 110.

Thereby, comparator 106 can always have a positive signal at its input. This signal is the modulus of the electrical signal generated by sensor 102. Main comparator 106 behaves like a normal comparator in a unipolar switch, but because the modulus of the magnetic signal is present at its input, omnipolar behavior is seen at output 112.

Figure 3:
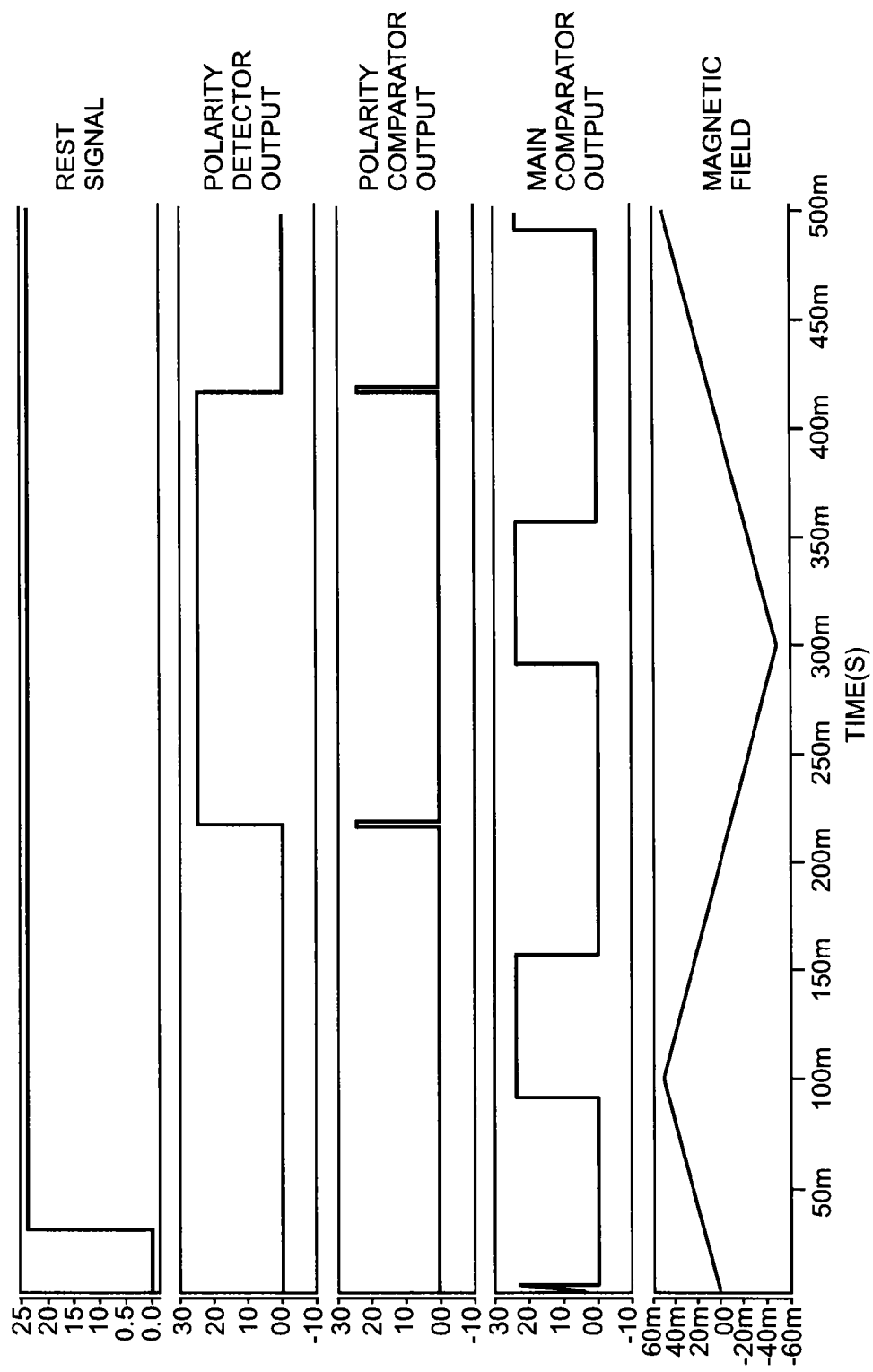
FIG. 3 depicts simulation results according to an embodiment.

Simulated signal values are depicted in FIG. 3, which shows the output of switch 100, main comparator output, toggling high and low when the magnetic signal reaches the positive and negative thresholds of switch 100. This is enabled by the polarity comparator output toggling the polarity detector output each time the magnetic field crosses zero. In one embodiment, polarity detection circuitry 110 requires a reset at start-up, and a reset signal in included in FIG. 3.

Embodiments provide advantages over conventional solutions. First, less die area is required and current consumption is reduced, at least in part because only a single high-precision comparator 106 is used and polarity comparator 108 does not require high accuracy. Further, all thresholds are symmetrical in embodiments because they are generated in a single comparator. Compared with other conventional solutions, embodiments also offer continuous time evaluation of the magnetic signal, with no extra delay on the signal path to induce omnipolar behavior. Additionally, if polarity detection circuitry 110 is kept in reset mode, switch 100 will behave as a unipolar switch, providing versatility.

Switch 100 can comprise additional components in other embodiments. For example, a bias block can be added to generate reference voltages and currents for other circuitry components. An oscillator and sequencer can be required in embodiments if a current spinning technique is used by Hall sensor 102 or to put the switch 100 into a different working mode, e.g., low-power. A voltage regulator can supply an internally regulated voltage to the components of switch 100, such as if high voltage capabilities are required. An amplifier can be added if the amplitude of the signal generated by Hall sensor 102 is too small to be processed correctly. An output stage can also be added according to the output type desired, such as open-drain, push-pull, and current interface as examples. Embodiments can therefore comprise one, some or all of these and other additional components, as appreciated by those skilled in the art.

Figure 4A:
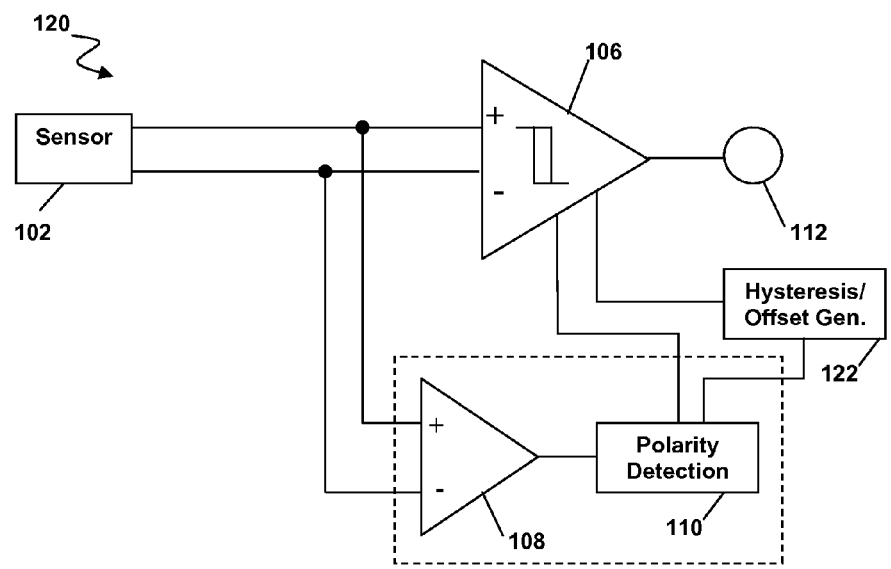
FIG. 4A depicts a block diagram of circuitry according to an embodiment.
Figure 4B:
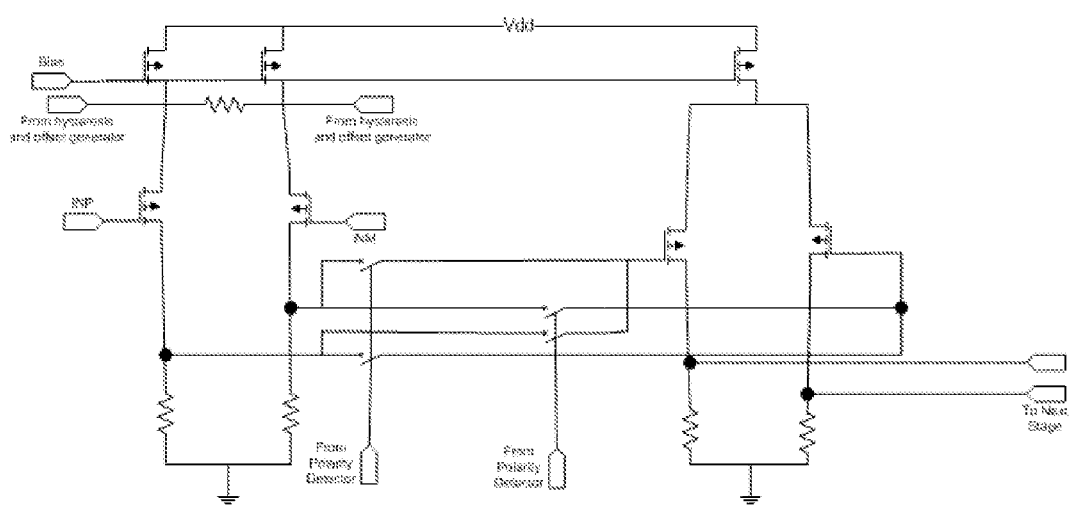
FIG. 4B depicts a comparator circuit diagram according to an embodiment.
Figure 5:
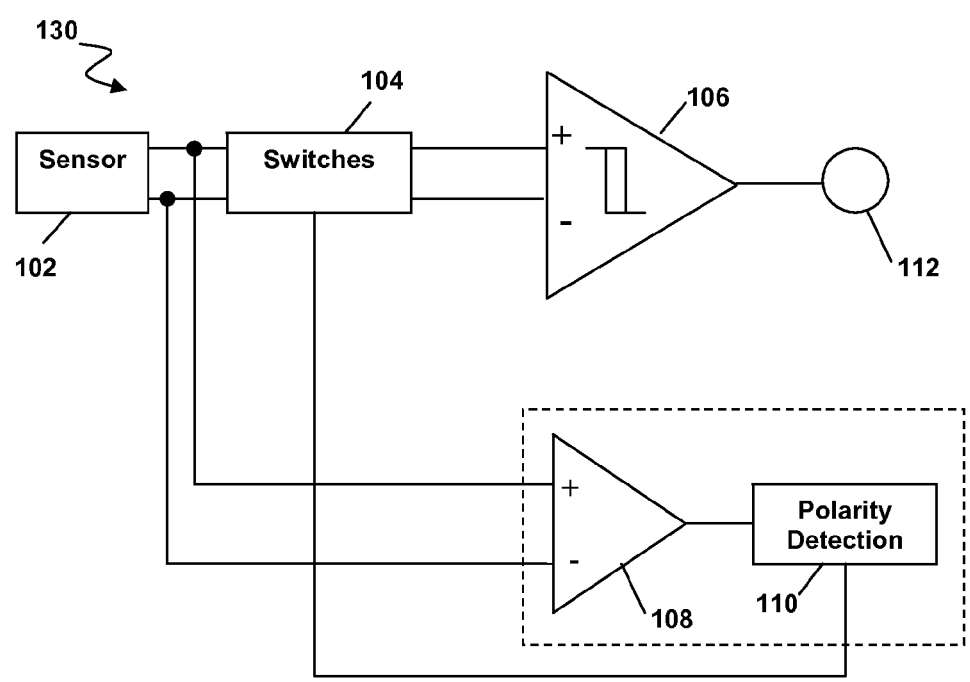
FIG. 5 depicts a block diagram of circuitry according to an embodiment.

Another embodiment of a switch 120 is depicted in FIG. 4A. Switch 120 is similar to switch 100 but omits switches 104 and includes a modification to internal connections in comparator 106 to facilitate a direct coupling of polarity detection circuitry 110 to comparator 106. A modified differential stage of comparator 106 according to an embodiment is depicted in FIG. 4B. Switch 120 also comprises hysteresis and offset generation circuitry 122. Circuitry 122 generates hysteresis and offset for the output behavior of the chip. Because the signals in comparator 106 are cross-coupled after the input stage, where the hysteresis and offset are added, the latter are generated according to the polarity of the input signal. Although only specifically depicted in FIG. 4A, hysteresis and offset generation circuitry 122 can be included in other embodiments, including switches 100 (FIG. 1) and 130 (FIG. 5).

In another embodiment, the inputs of polarity comparator 108 can be coupled before switches 104, and the polarity detector 110 can be sensitive to both positive-to-negative and negative-to-positive transitions. This is depicted in circuitry 130 in FIG. 5.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An omnipolar magnetic switch comprising:
a magnetic sensor configured to generate an electric signal from a sensed magnetic field;
switching circuitry coupled to the magnetic sensor to receive and selectively invert the electric signal;
first comparator coupled to the switching circuitry to receive the electric signal or an inverted electrical signal as input from the switching circuitry and to evaluate an amplitude of the input and toggle high or low when the amplitude passes above a first threshold or below a second threshold;
a second comparator coupled to inputs of the first comparator to detect positive-to-negative and negative-to-positive transitions of the electric signal generated by the magnetic sensor; and
polarity detection circuitry coupled to the second comparator to detect a positive-to-negative transition and coupled to the switching circuitry to instruct the switching circuitry to selectively invert the electric signal when a positive-to-negative transition is detected.

2. The switch of claim 1, wherein the magnetic sensor is a Hall effect sensor.

3. The switch of claim 1, wherein the first comparator is a high-precision comparator when compared with the second comparator.

4. The switch of claim 3, wherein the first comparator occupies a larger chip area than the second comparator.

5. The switch of claim 3, wherein the second comparator has a lower current consumption than the first comparator.

6. The switch of claim 1, wherein the electric signal or the selectively inverted signal received by the first comparator is always positive.

7. A method comprising:
sensing a magnetic field signal;
converting, the magnetic field signal into an electric signal;
detecting a positive-to-negative transition of the electric signal;
inverting the electric signal upon detection of a positive-to-negative transition; and
toggling an output when an amplitude of the electric signal passes above a first threshold or below a second threshold.

8. The method of claim 7, wherein sensing a magnetic field comprises sensing the magnetic field by a Hall sensor.

9. The method of claim 7, wherein the detecting is carried out by a polarity detector and the toggling, is carried out b a first comparator.

10. The method of claim 9, wherein the polarity detector comprises a second comparator and polarity detection circuitry.

11. The method of claim 10, wherein the first comparator is a higher-precision comparator than the second comparator.

12. The method of claim 10, therein the inverting is carried out by switching circuitry.

13. An omnipolar switch comprising:
a magnetic sensor;
switching circuitry coupled to an output of the magnetic sensor;
first comparator circuitry coupled to an output of the switching circuitry;
second comparator circuitry coupled to the output of the switching circuitry; and
polarity detecting circuitry coupled to an output of the second comparator circuitry and to an input of the switching circuitry.

14. The switch of claim 13, wherein the magnetic sensor is a Hall sensor.

15. The switch of claim 13, wherein a precision of first comparator circuitry is higher than a precision of the second comparator circuitry.

16. The switch of claim 13, wherein a signal received by the first comparator circuitry from the switching circuitry is positive.

17. An omnipolar magnetic switch comprising;
a magnetic sensor configured to generate an electric signal from a sensed magnetic field;
a first comparator coupled to the magnetic sensor to receive the electric signal and to evaluate an amplitude of the input and toggle high or low when the amplitude passes above a first threshold or below a second threshold;
a second comparator coupled to inputs of the first comparator to detect positive-to-negative and negative-to-positive transitions of the electric signal generated by the magnetic sensor;
polarity detection circuitry coupled to the second comparator to detect positive-to-negative and negative-to-positive transitions and coupled to the first comparator to instruct the first comparator to selectively invert the electric signal when positive-to-negative and negative-to-positive transitions are detected; and
hysteresis and offset generation circuitry coupled between the polarity detection circuitry and the first comparator.

18. A signal modulus extraction circuit comprising:
an electrical signal generator to generate an electrical signal;
switching circuitry coupled to the signal generator to receive and selectively invert the electrical signal;
a comparator coupled to an output of the switching circuitry to detect positive-to-negative and negative-to-positive transitions of the electrical signal generated by the electrical signal generator; and polarity detection circuitry coupled to an output of the comparator to instruct the switching circuitry to selectively invert the electrical signal when a positive-to-negative transition is detected.

19. The circuit of claim 18, wherein the electrical signal generator is a magnetic field sensor.

20. An omnipolar magnetic switch comprising:
a magnetic sensor configured to generate an electric signal from a sensed magnetic field;
switching circuitry coupled to the magnetic sensor to receive and selectively invert the electric signal:
a first comparator coupled to the switching circuitry to receive at least one of the electric signal or an inverted electric signal as input from the switching circuitry and to evaluate an amplitude of the input, and toggle high or low when the amplitude passes above a first threshold or below a second threshold;
a second comparator coupled to the magnetic sensor to receive the electric signal and detect positive-to-negative and negative-to-positive transitions of the electric signal; and
polarity detection circuitry coupled to the second comparator to detect positive-to-negative and negative-to-positive transitions and coupled to the switching circuitry to instruct the switching circuitry to selectively invert the electric signal when positive-to-negative and negative-to-positive transitions are detected.

* * * * *